United States Patent [19]

Mandelman et al.

[11] Patent Number: 5,521,422
[45] Date of Patent: May 28, 1996

[54] CORNER PROTECTED SHALLOW TRENCH ISOLATION DEVICE

[75] Inventors: Jack A. Mandelman, Stormville, N.Y.; Brian J. Machesney, Burlington, Vt.; Hing Wong, Norwalk, Conn.; Michael D. Armacost, Wallkill, N.Y.; Pai-Hung Pan, Boise, Id.

[73] Assignee: International Business Machines Corporation, Armonk, N.Y.

[21] Appl. No.: 348,709

[22] Filed: Dec. 2, 1994

[51] Int. Cl.⁶ .................................................. H01L 29/00
[52] U.S. Cl. ........................ 257/510; 257/513; 257/622; 257/623; 257/626
[58] Field of Search .................................. 257/301, 302, 257/303, 304, 305, 905, 510, 513, 524, 622, 623, 626, 647

[56] References Cited

U.S. PATENT DOCUMENTS

| | | | |
|---|---|---|---|
| 4,389,294 | 6/1983 | Anantha et al. | 204/192 |
| 4,502,913 | 3/1985 | Lechaton et al. | 257/513 |
| 4,506,434 | 3/1985 | Tetsuya et al. | 29/571 |
| 4,814,840 | 3/1989 | Kameda | 257/301 |
| 4,836,885 | 6/1989 | Breiten et al. | 156/643 |
| 4,873,203 | 10/1989 | Kagu et al. | 437/67 |
| 4,966,870 | 10/1990 | Barber et al. | 437/228 |
| 4,988,637 | 1/1991 | Dhong et al. | 437/52 |
| 4,998,161 | 3/1991 | Kimura et al. | 357/23.4 |
| 5,064,777 | 11/1991 | Dhong et al. | 437/52 |
| 5,160,988 | 11/1992 | Higuchi et al. | 257/301 |
| 5,173,439 | 12/1992 | Dash et al. | 437/67 |
| 5,250,831 | 10/1993 | Ishii | 257/305 |
| 5,260,588 | 11/1993 | Ohta et al. | 257/623 |
| 5,275,965 | 1/1994 | Manning | 437/67 |
| 5,292,670 | 3/1994 | Sundaresan | 437/21 |
| 5,298,434 | 3/1994 | Strater et al. | 437/21 |

FOREIGN PATENT DOCUMENTS

| | | | |
|---|---|---|---|
| 401537 | 12/1990 | European Pat. Off. | 257/301 |
| 4-56279 | 2/1992 | Japan | 257/622 |

OTHER PUBLICATIONS

T. Furukawa et al., "Process and Device Simulation of Trench Isolation Corner Parasitic Device", Procedings of the Electrochemical Society Meeting, Oct. 9–14, 1988, pp. 1–2.

A. Bryant et al., "The Current–Carrying Corner Inherent to Trench Isolation", IEEE Electron Device Letters, vol. 14, No. 8, Aug. 1993, pp. 412–414.

D. Foty et al., "Behavior of an NMOS Trench–Isolated Corner Parasitic Devide at Low Temperature", Proceedings of the Electrochemical Society Meeting, Oct. 1989, pp. 1–2.

T. Ishijima et al., "A Deep–Submicron Isolation Technology with T–shaped Oxide (TSO) Structure", Proceedings of the IEDM, 1990, pp. 257–260.

P. C. Fazan et al., "A Highly Manufacturable Trench Isolation Process for Deep Submicron DRAMs", Proceedings of the IEDM, 1993, pp. 57–60.

J. F. Shepard, "Method to Reduce Loss of Isolation Trench Insulation", IBM Technical Disclosure Bulletin, vol. 33, No. 10A, pp. 298–299, Mar. 1991.

C. W. Kaanta et al, "Use of Easily Removable Sacrificial Layer to Suppress Chemical–Mechanical Overpolish Damage", IBM Technical Disclosure Bulletin, vol. 34, No. 4B, pp. 343–344, Sep. 1991.

Primary Examiner—Sara W. Crane
Assistant Examiner—Alice W. Tang
Attorney, Agent, or Firm—James M. Leas

[57] ABSTRACT

A semiconductor structure to prevent gate wrap-around and corner parasitic leakage comprising a semiconductor substrate having a planar surface. A trench is located in the substrate, the trench having a sidewall. An intersection of the trench and the surface forms a corner. A dielectric lines the sidewall of the trench. And, a corner dielectric co-aligned with the corner extends a subminimum dimension distance over the substrate from the corner.

10 Claims, 5 Drawing Sheets

CORNER PROTECTED SHALLOW TRENCH ISOLATION DEVICE

FIELD OF THE INVENTION

This invention relates generally to semiconductor structures having a trench isolation. More particularly, it relates to field effect transistor devices adjacent a corner of a trench used for isolation and methods of avoiding corner parasitic leakage cement.

BACKGROUND OF THE INVENTION

Contemporary CMOS technologies employ field effect transistors that are adjacent or bounded by trenches. The trenches may provide isolation (shallow trench isolation, or STI) or they may provide a location for semiconductor devices, such as capacitors. Parasitic leakage paths have been found because of the proximity of a semiconductor device to an edge or corner of a trench.

In one mechanism, described in a paper, "Process and Device Simulation of Trench Isolation Corner Parasitic Device," by T. Furukawa and J. A. Mandelman, published in the Proceedings of the Electrochemical Society Meeting, Oct. 9–14, 1988, the parasitic leakage path results from an enhancement of the gate electric field near the trench corner. The electric field is enhanced by the corner's small radius of curvature and the proximity of the gate conductor. Processing can exacerbate the problem by sharpening the corner and thinning the gate dielectric near the corner. In addition, in a worst case scenario for corner field enhancement, the gate conductor wraps around the trench corner. This happens when the oxide fill in the isolation trench is recessed below the silicon surface during oxide etches following its formation.

As a result of the enhanced field, the corner has a lower threshold voltage (Vt) than the planar portion of the device. Thus, a parallel path for current conduction is formed. However, for device widths used in contemporary technologies, the top planar portion of the device carries most of the on-current. Trench corner conduction is a parasitic which usually contributes appreciably only to sub-threshold leakage. This parasitic leakage current along the corner is most easily seen as a hump in the subthreshold current curve of a narrow MOSFET.

As mentioned in a paper, "The Current-Carrying Corner Inherent to Trench Isolation," by Andres Bryant, W. Haensch, S. Geissler, Jack Mandelman, D. Poindexter, and M. Steger, published in the IEEE Electron Device Letters, Vol. 14, No. 8, Aug., 1993, the corner device can even dominate on-currents in applications such as DRAM that require narrow channel widths to achieve high density. This parallel current-carrying corner device becomes the dominant MOSFET contributor to standby current in low standby power logic applications and to leakage in DRAM cells. Furthermore, there exists concern that the enhanced electric fields due to field crowding at the corner impact dielectric integrity.

A paper, "Behavior of an NMOS Trench-Isolated Corner Parasitic Device at Low Temperature," by D. Foty, J. Mandelman, and T. Furukawa, published in the Proceedings of the Electrochemical Society Meeting, October, 1989, suggests that the corner parasitic device does not improve with decreasing temperature nearly as much as the planar sub-threshold slope. Thus, the corner parasitic device may be more of a problem at low temperature than the planar device.

This corner leakage problem has commonly been controlled with an increased threshold tailor implant dose, but this can degrade device performance. Thus, alternate schemes for controlling the corner are needed.

A paper, "A Deep-Submicron Isolation Technology with T-shaped Oxide (TSO) Structure," by T. Ishijima et. al., *Proceedings of the IEDM*, 1990, p. 257, addresses the problem of trench sidewall inversion. This paper teaches the use of a pair of aligned photomasks to form a T-shaped oxide adjacent the comet of an isolation trench and the use of a channel stop boron implant along sidewalls of the trench. The structure moves the device away from the trench sidewall and provides boron to raise the Vt along that sidewall. However, isolation is enlarged when photomask alignment tolerances are included in this two-mask-and-implant scheme, making this solution undesirable. Thus, an improved means to control the corner parasitic is needed and is provided by the following invention.

SUMMARY OF THE INVENTION

It is therefore an object of the present invention to avoid corner leakage without degrading device performance.

It is another object of this invention to avoid recessing the isolation insulator adjacent the corner.

It is another object of this invention to avoid corner leakage and protect the isolation insulator without using device area.

It is another object of this invention to provide a self-aligned scheme for avoiding corner leakage and protecting the isolation insulator.

These and other objects of the invention are accomplished by providing a semiconductor structure comprising a semiconductor substrate having a planar surface. A trench having a sidewall is provided in the substrate. An intersection of the trench and the surface forms a corner. A dielectric lines the sidewall of the trench. And, a corner dielectric co-aligned with the corner extends no more than a subminimum dimension distance over the substrate from the corner.

In one embodiment the corner dielectric is a spacer self-aligned to the edge of the trench dielectric. In another embodiment, the corner dielectric is a spacer self-aligned to the edge of a window in insulator used as a mask to form the trench. In a third embodiment, this spacer defines the position of the trench, but the spacer is then removed. When the trench dielectric is later deposited, the trench dielectric forms the corner dielectric in the space provided by the removed spacer resulting in a unitary cap.

Methods of fabricating a semiconductor structure of the invention comprise the steps of (a) providing a semiconductor substrate having a substantially planar surface; (b) forming a coating on the substrate; (c) forming a window in the coating, the window having an edge; (d) forming a trench in the substrate, the trench having a sidewall co-aligned to the edge, an intersection of the trench and the surface forming a corner; (e) lining the sidewall and the edge with insulator; and (f) forming a material on the substrate adjacent the corner, the material extending around the trench parallel to the corner and extending no more than a subminimum distance from the corner.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present invention provides a self-aligned structure over the corner that eliminates a recess formed in an adjacent insulator lined trench. Such trenches include shallow trench isolation (STI) and deep trench capacitor. STI and processes for forming STI are described in commonly assigned U.S. Pat. No. 5,173,439, by Dash et. al., incorporated herein by reference. By eliminating the recess in the insulator, the gate wrap-around problem mentioned hereinabove is eliminated. The structure also offsets the gate conductor from the trench corner, further reducing the corner electric field. Several embodiments are taught, including structures that avoid narrowing the channel. The modified gate conductor geometry results in an electric field at the trench corner that is actually lower than the field at the top planar region (see FIGS. 6a–6b). The result is a device which is free of the above mentioned high corner electric field parasitic effects. In addition, applicants have found that, as a result of increased corner field where the gate conductor overlaps the drain diffusion, gate induced drain leakage (GIDL) is significantly increased. By eliminating the high field at the corner, the present invention also eliminates this GIDL concern.

In one embodiment, illustrated in FIGS. 1a–1e, a corner dielectric is provided self-aligned to raised STI. The corner dielectric is a spacer that protects the STI corner from attack by subsequent etches and that spaces a later formed FET away from the corner.

Figure 1A:
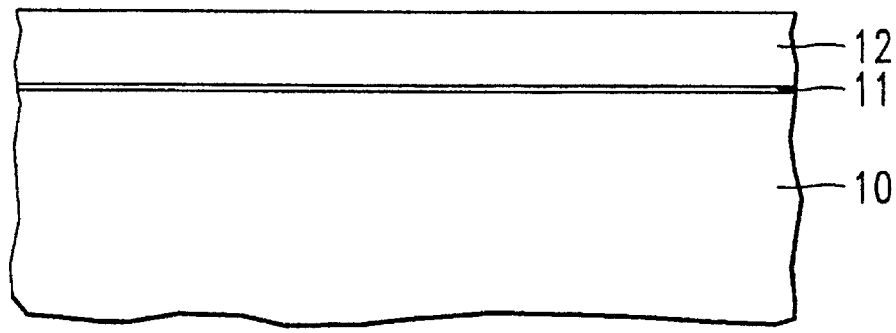
FIGS. 1a–1e are cross sectional views showing the structure at several steps in the process for making a semiconductor structure of a first embodiment of the present invention.
Figure 1B:
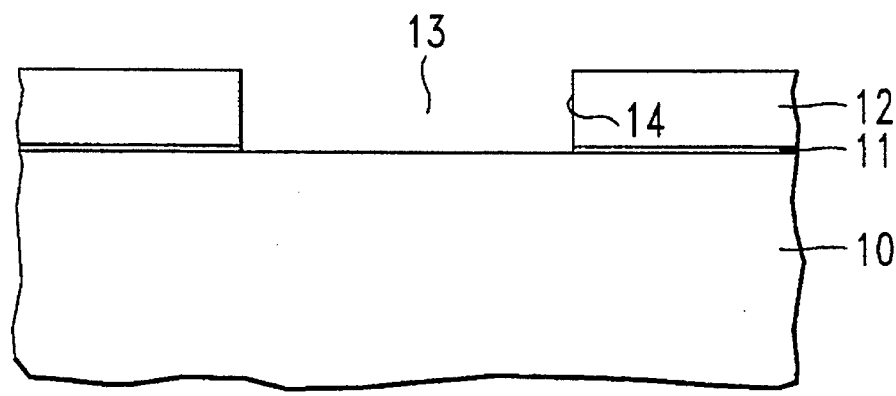
Figure 1C:
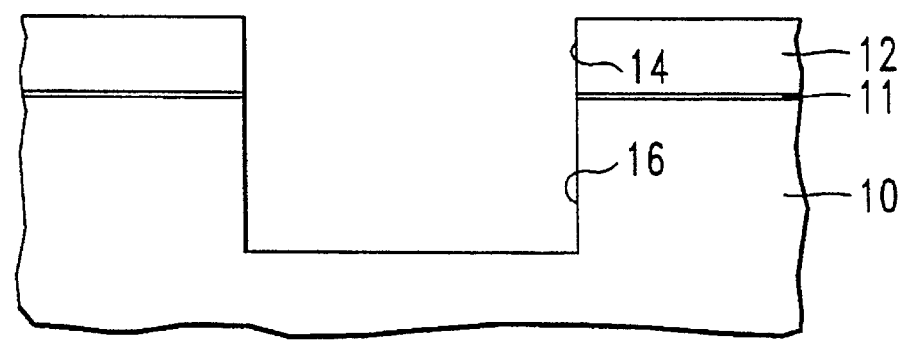

In the process, silicon substrate 10 is provided with a pad oxide 11 and nitride surface coating 12 as illustrated in FIG. 1a. Window 13 with nearly vertical sidewall 14 is photolithographically defined in surface coating 12 and oxide 11 as shown in FIG. 1b. Then trench 16 is etched, defined by window 13 as illustrated in FIG. 1c.

Figure 1D:
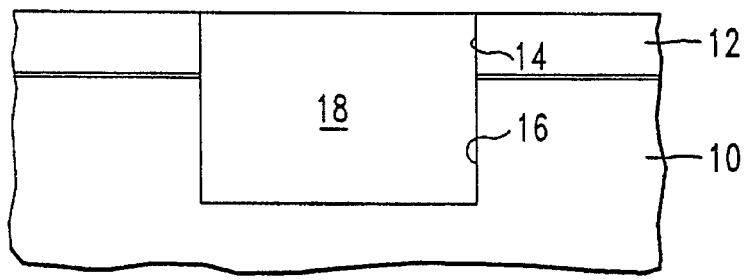
Figure 1E:
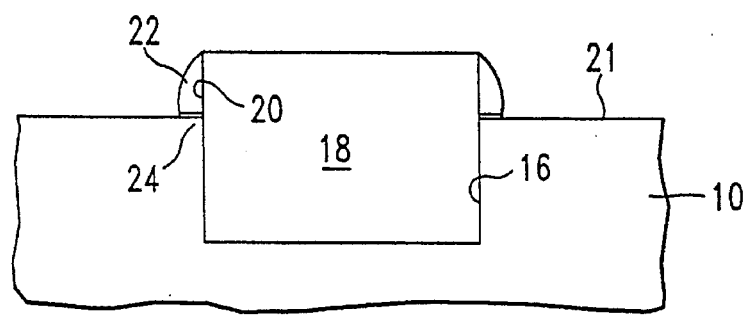

Trench 16 and window 13 are then filled with insulator 18. Insulator 18 is then polished, stopping on surface coating 12 as illustrated in FIG. 1d. Then surface coating 12 is removed, leaving insulator 18 with nearly vertical sidewalls 20 extending above the surface 21 of silicon substrate 10.

Spacer 22 is then provided self-aligned to sidewall 20 of insulator 18 by the standard process of depositing a spacer insulator having a desired thickness and directional etching to selectively remove the spacer insulator from horizontal surfaces. The spacer insulator can be a material such as CVD oxide, oxidized polysilicon, TEOS, silicon nitride, and boron nitride. Spacer 22 protects the STI adjacent corner 24 during subsequent etches, preventing divoting and gate wrap-around. Preferably, spacer 22 has a dimension that is less than the minimum photolithographic dimension capable of being formed by a particular process technology.

In a preferred embodiment, at least a portion of spacer 22 remains in place after subsequent etches, thereby also moving the gate controlled channel region of a later formed FET away from corner 24. Thus, high field effects including the corner parasitic FET and GIDL at the drain diffusion are eliminated. No additional photomasking is required for the formation of spacers 22, a significant advantage over the prior art.

Several experiments have been performed to confirm that the RIE proposed for the spacer formation is not detrimental to device characteristics. Results indicate that flatband and breakdown characteristics of silicon on which spacers have been formed are not degraded.

Figure 2:
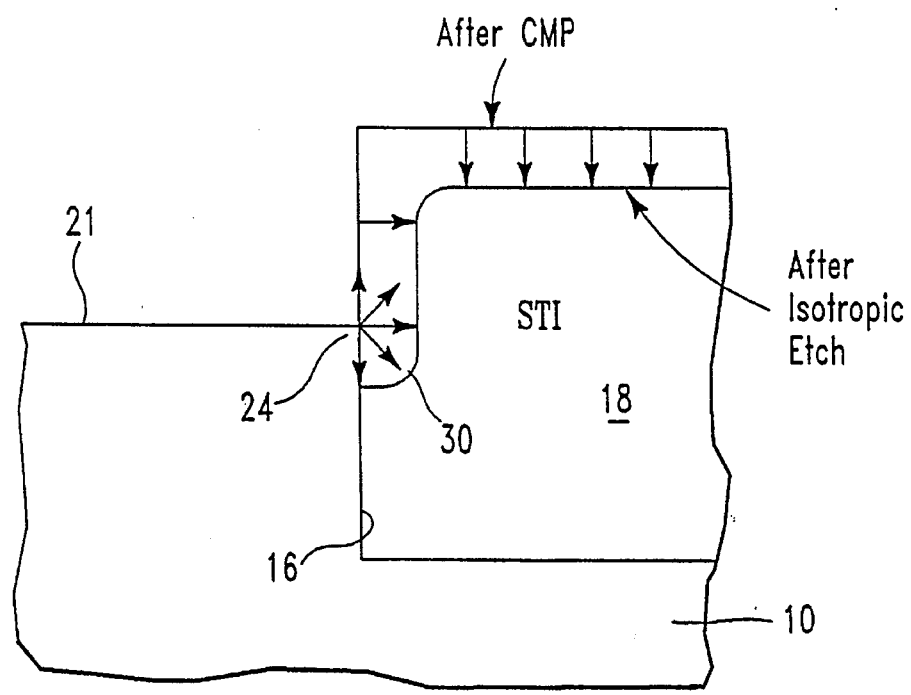
FIG. 2 is a cross sectional view showing a structure illustrating how gate wrap-around occurs with conventional processing.

FIG. 2 illustrates a mechanism responsible for gate wrap-around and shows how the present invention eliminates this problem. Divot 30 in insulator 18 in trench 16 adjacent corner 24 arises during isotropic etches used in standard semiconductor processing after trench 16 is filled with insulator 18. Divot 30 is formed adjacent corner 24 as a result of the vertical and horizontal attack by etch ant on insulator at corner 24. By providing a sufficiently thick spacer 22 over corner 24 (FIG. 1e), etchant cannot access and form a recess or divot in insulator 18.

In a second embodiment, illustrated in FIGS. 3a–3e, a corner dielectric is also provided self-aligned to raised STI. The corner dielectric is again a spacer that protects the STI corner from attack by subsequent etches and that spaces a later formed FET away from the corner. But in this embodiment the spacer is formed before the STI, it is inverted compared to the spacer of the first embodiment, and it is formed within the minimum dimension space of the isolation. Thus, unlike the first embodiment presented hereinabove, in this embodiment no device area is consumed by the corner dielectric, a significant advantage. Furthermore, in this embodiment, the RIE etching of the spacer does not effect the device region.

Figure 3A:
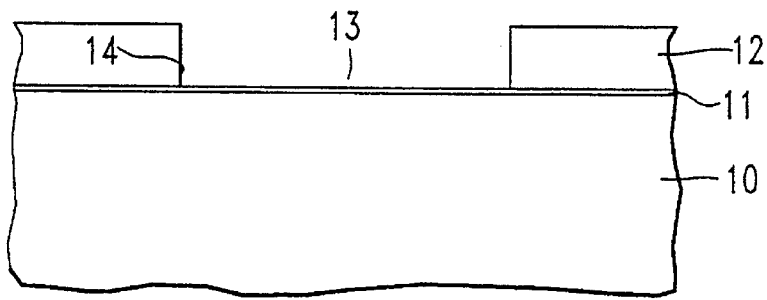
FIG. 3a–3e are cross-sectional views showing the structure at several steps in the process for making a semiconductor structure of the second embodiment of the present invention.
Figure 3B:
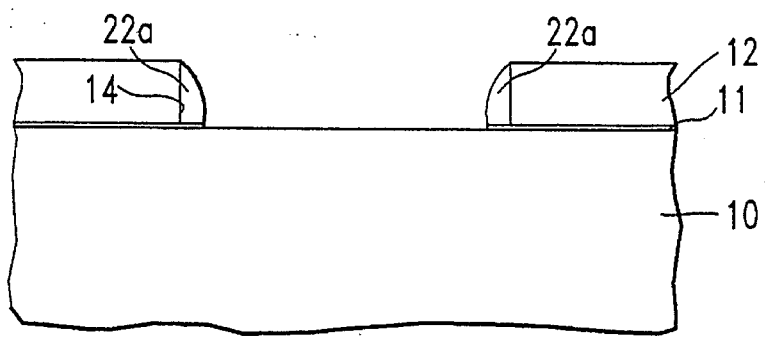

In the process, silicon substrate 10 is again provided with nitride surface coating 12. Window 13 with nearly vertical sidewall 14 is again photolithographically defined in surface coating 12 as shown in FIG. 3a. In the next step, spacer 22a is formed along sidewall 14 of coating 12. Then trench 16 is etched, defined by spacer 22a in window 13 as illustrated in FIG. 1c. Then, as illustrated in FIG. 1d, trench 16 and window 13 are filled with insulator 18. Insulator 18 is then polished, stopping on surface coating 12. Then surface coating 12 is removed, leaving insulator 18 with spacer 22a extending above the surface 21 of silicon substrate 10.

As with the first embodiment, spacer 22a protects the STI adjacent corner 24 during subsequent etches, preventing divoting and gate wrap-around. Similarly, at least a portion of spacer 22a remains in place after subsequent etch steps, moving a later formed FET away from corner 24. And no additional photomasking is required for the formation of spacer 22a. This embodiment has a significant advantage over the first embodiment in that spacer 22a is within window 13, which can have a minimum dimension. Thus, spacer 22a does not take up device area, an advantage particularly for narrow devices such as DRAM cells. Trench 16 can have a dimension that is a subminimum dimension.

Figure 3C:
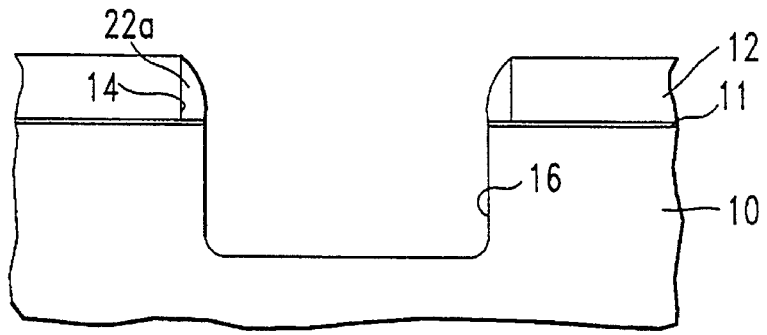
Figure 3D:
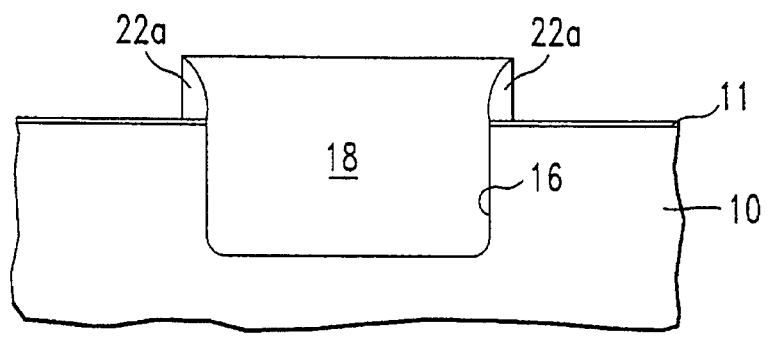
Figure 3E:
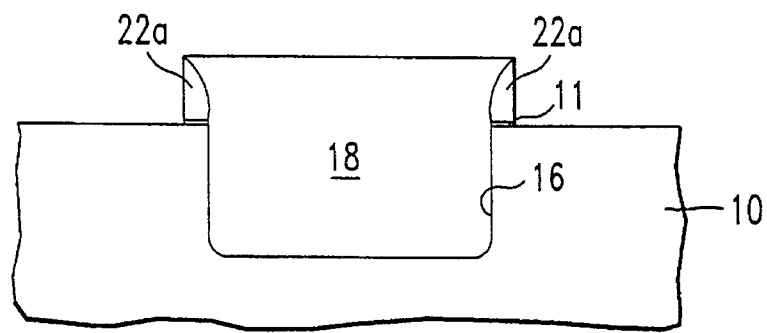
Figure 4A:
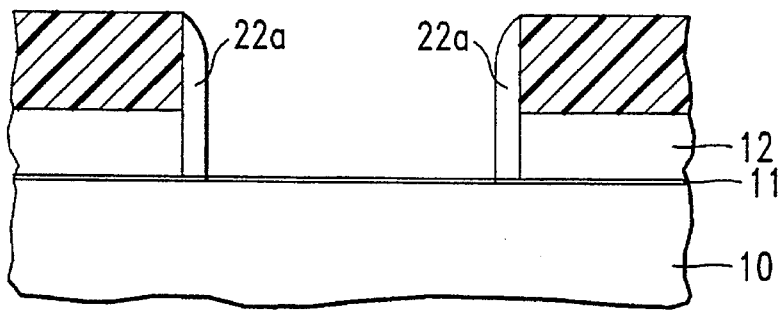
FIG. 4a–4c cross-sectional views showing the structure at several steps in the process for making a semiconductor structure of the third embodiment of the present invention.
Figure 4B:
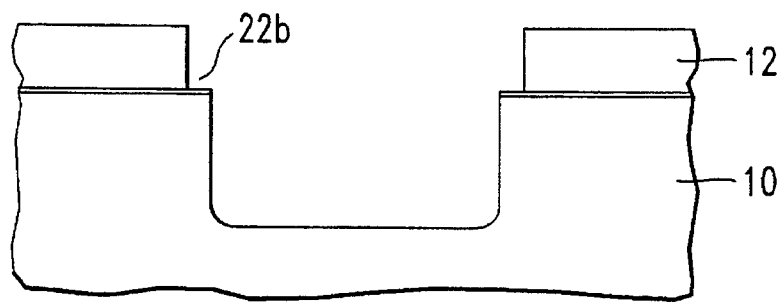
Figure 4C:
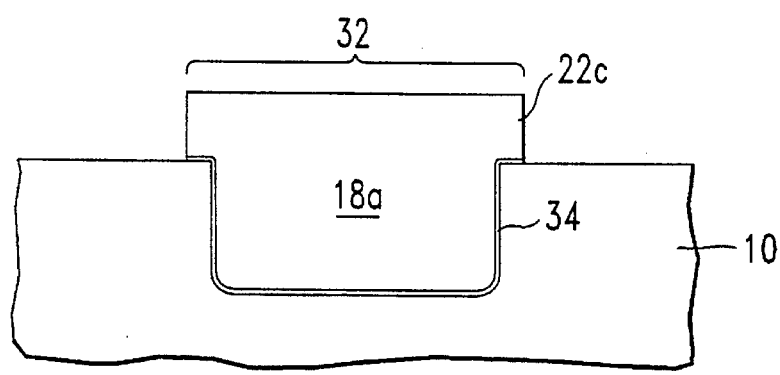

In a third embodiment, illustrated in FIGS. 4a–4c, a unitary structure having a corner dielectric co-aligned with the corner and extending a subminimum dimension distance over the substrate from the corner is provided. In this case corner dielectric 22c is not itself a spacer but it fills the space left when previously formed spacer 22a is removed. This embodiment differs from the second embodiment in that spacer 22a of FIG. 3c is removed after trench 16 is etched as illustrated in FIG. 4b. Then, insulator 18a is deposited to fill both trench 16 and the space 22b left vacant by removed spacer 22a. After polishing, coating 12 is removed leaving a unitary raised STI structure having a subminimum dimension corner dielectric 22c, as illustrated in FIG. 4c. In this unitary structur, corner dielectric 22c and insulator 18a are formed of the same material. As with the second embodiment, corner dielectric 22c does not take up device area. Trench 16 can have a subminimum dimension while the isolation as a whole 32 covers no more than a minimum dimension. FIG. 4c also illustrates the formation of thermal oxide layer 34 before deposition of insulator 18a, as is well known in the art.

As used in this application the phrase, "a corner dielectric co-aligned with the corner" means that the corner dielectric is aligned to an original edge to which the corner is also aligned (or either or both are aligned to an edge, such as a spacer edge, derived from the original edge). Similarly, the phrase "a trench having a sidewall co-aligned to an edge," means that the sidewall is aligned to an original edge to which the edge is also aligned (or either or both are aligned to an edge, such as a spacer edge, derived from the original edge). Separate photolithography steps are avoided by using co-aligned structures; both structures are formed from a single masking step aligned to the same mask edge. Little or no additional surface area is consumed compared to processes requiring separate photolithography steps for both structures.

Figure 5:
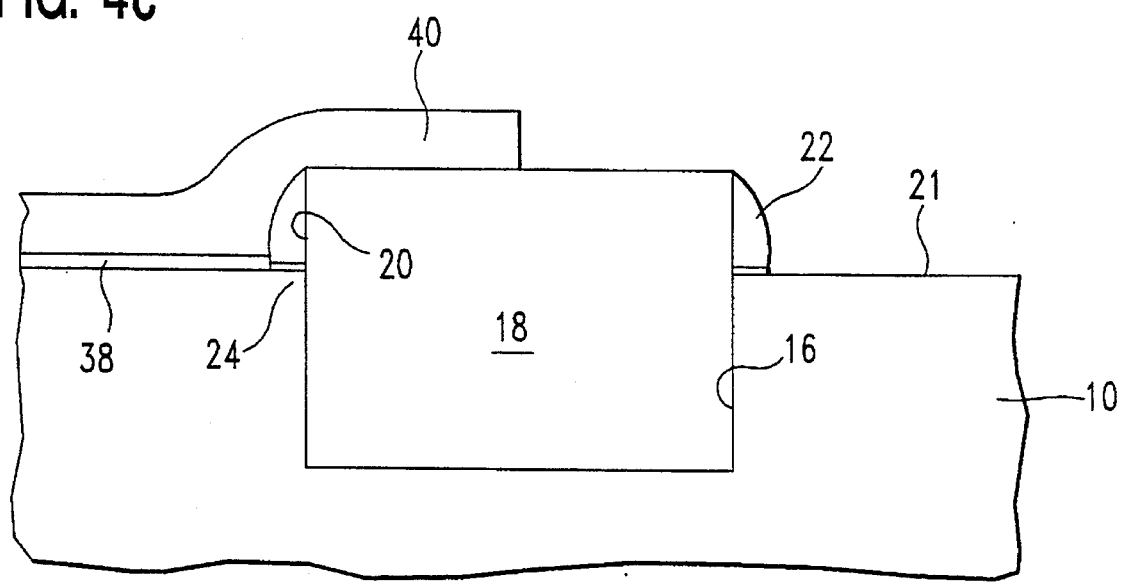
FIG. 5 is cross-sectional view showing the structure of a MOSFET adjacent an isolation of the present invention.

With any of the above embodiments, a MOSFET can then formed bounded by a corner dielectric rather than the corner and sidewall of the STI. As illustrated in FIG. 5, gate dielectric 38 is formed by conventional processing. Gate conductor 40 is then deposited and photolithographically defined. Gate conductor 40 is spaced from corner 24 by corner dielectric 22, 22a, or 22c. Thus, the electric field in the corner region is significantly reduced.

Figures 6A, 6B:
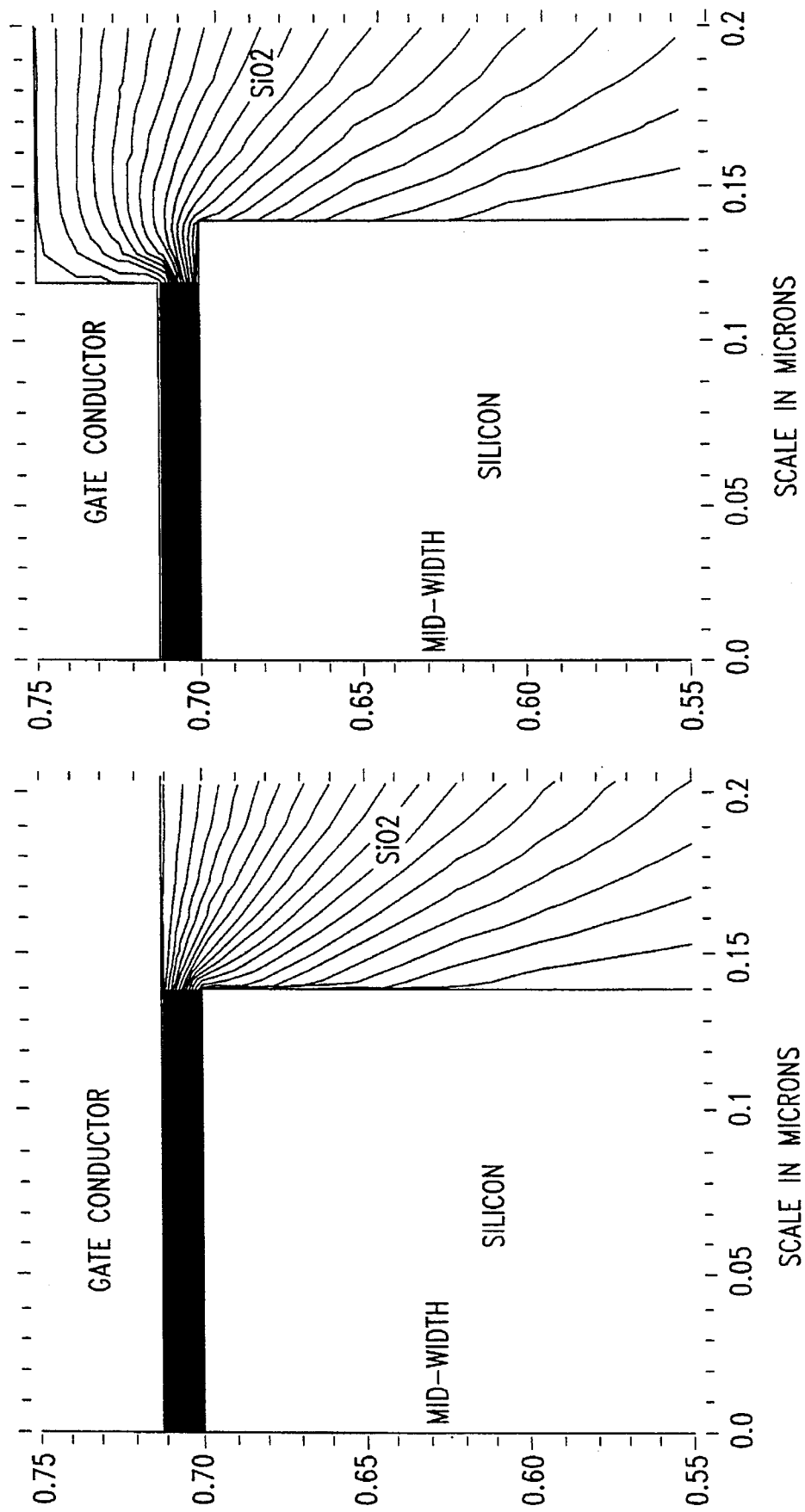
FIG. 6a is a simulation plot showing equipotential lines for a MOSFET adjacent an isolation with conventional geometry.
FIG. 6b is a simulation plot showing equipotential lines for a MOSFET adjacent an isolation with the geometry of the present invention.

Device modeling, illustrated in FIGS. 6a–6b, shows that the modified geometry described here results in a drastic reduction of the trench corner electric field. Parasitic conduction and the GIDL concerns due to high corner fields are eliminated.

While several embodiments of the invention, together with modifications thereof, have been described in detail herein and illustrated in the accompanying drawings, it will be evident that various further modifications are possible without departing from the scope of the invention. For example, the trench need not be filled with insulator. The insulator can be a thin lining along a sidewall or along the top portion of the sidewall. The examples given are intended only to be illustrative rather than exclusive and nothing in the above specification is intended to limit the invention more narrowly than the appended claims.

What is claimed is:

1. A semiconductor structure comprising:
   a semiconductor substrate having a planar surface;
   a trench in said substrate, said trench having a sidewall, an intersection of said trench and said surface forming a corner;
   a corner dielectric co-aligned with said corner and extending over said surface; and
   a field effect transistor having a channel having a current path extending parallel to said corner, said channel being spaced from said corner by said corner dielectric.

2. A semiconductor structure as recited in claim 1, wherein said corner dielectric comprises a spacer.

3. A semiconductor structure as recited in claim 1 wherein said corner dielectric comprises one of silicon dioxide, silicon nitride, and boron nitride.

4. A semiconductor structure as recited in claim 1 wherein said trench is a shallow trench isolation.

5. A semiconductor structure as recited in claim 1, further comprising an insulator in said trench, wherein said insulator fills said trench.

6. A semiconductor structure as recited in claim 1, further comprising an insulator in said trench, wherein said corner dielectric and said insulator comprise the same material.

7. A semiconductor structure as recited in claim 6, wherein said corner dielectric and said trench dielectric are a unitary structure.

8. A semiconductor structure as recited in claim 1, said channel being defined by a gate, said gate being spaced from said corner by said corner dielectric.

9. A semiconductor structure as recited in claim 8, said corner dielectric comprising a spacer.

10. A semiconductor structure as recited in claim 9, further comprising an insulator in said trench, wherein said insulator fills said trench.

\* \* \* \* \*